(12) United States Patent
Kobayashi et al.

(10) Patent No.: US 9,093,420 B2
(45) Date of Patent: Jul. 28, 2015

(54) METHODS FOR FABRICATING HIGH VOLTAGE FIELD EFFECT TRANSISTOR FINGER TERMINATIONS

(71) Applicant: RF Micro Devices, Inc., Greensboro, NC (US)

(72) Inventors: Kevin Wesley Kobayashi, Redondo Beach, CA (US); Haldane S. Henry, Greensboro, NC (US); Andrew P. Ritenour, Colfax, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/795,986

(22) Filed: Mar. 12, 2013

(65) Prior Publication Data

US 2013/0280877 A1     Oct. 24, 2013

Related U.S. Application Data

(60) Provisional application No. 61/625,929, filed on Apr. 18, 2012.

(51) Int. Cl.
  *H01L 21/84* (2006.01)
  *H01L 29/423* (2006.01)
  (Continued)

(52) U.S. Cl.
  CPC ........ *H01L 29/42316* (2013.01); *H01L 29/402* (2013.01); *H01L 29/41725* (2013.01); *H01L 29/66462* (2013.01); *H01L 29/66477* (2013.01);
  (Continued)

(58) Field of Classification Search
  CPC ....................... H01L 29/66462; H01L 27/1214
  See application file for complete search history.

(56) References Cited

U.S. PATENT DOCUMENTS

| 4,317,055 A | 2/1982 | Yoshida et al. |
| 4,540,954 A | 9/1985 | Apel |

(Continued)

FOREIGN PATENT DOCUMENTS

| EP | 1187229 A1 | 3/2002 |
| EP | 1826041 A1 | 8/2007 |

(Continued)

OTHER PUBLICATIONS

Chang, S.J. et al., "Improved ESD protection by combining InGaN-GaN MQW LEDs with GaN Schottky diodes," IEEE Electron Device Letters, Mar. 2003, vol. 24, No. 3, pp. 129-131.

(Continued)

*Primary Examiner* — Zandra Smith
*Assistant Examiner* — Andre' C Stevenson
(74) *Attorney, Agent, or Firm* — Withrow & Terranova, P.L.L.C.

(57) ABSTRACT

Methods for fabricating a field effect transistor having at least one structure configured to redistribute and/or reduce an electric field from gate finger ends are disclosed. The methods provide field effect transistors that each include a substrate, an active region disposed on the substrate, at least one source finger in contact with the active region, at least one drain finger in contact with the active region, and at least one gate finger in rectifying contact with the active region. One embodiment has at least one end of the at least one gate finger extending outside of the active region. At least one method includes etching at least one gate channel into the passivation layer with a predetermined slope that reduces electric fields at a gate edge. Other methods include steps for fabricating a sloped gate foot, a round end, and/or a chamfered end to further improve high voltage operation.

19 Claims, 8 Drawing Sheets

(51) Int. Cl.
*H01L 29/812* (2006.01)
*H01L 29/66* (2006.01)
*H01L 29/40* (2006.01)
*H01L 29/417* (2006.01)
*H01L 29/778* (2006.01)
*H01L 29/16* (2006.01)
*H01L 29/20* (2006.01)

(52) U.S. Cl.
CPC .......... *H01L 29/7787* (2013.01); *H01L 29/812* (2013.01); *H01L 29/1608* (2013.01); *H01L 29/2003* (2013.01)

(56) References Cited

U.S. PATENT DOCUMENTS

| | | | |
|---|---|---|---|
| 4,543,535 A | | 9/1985 | Ayasli |
| 4,620,207 A * | | 10/1986 | Calviello ............ 257/263 |
| 4,788,511 A | | 11/1988 | Schindler |
| 5,028,879 A | | 7/1991 | Kim |
| 5,046,155 A | | 9/1991 | Beyer et al. |
| 5,047,355 A | | 9/1991 | Huber et al. |
| 5,107,323 A | | 4/1992 | Knolle et al. |
| 5,118,993 A | | 6/1992 | Yang |
| 5,208,547 A | | 5/1993 | Schindler |
| 5,227,734 A | | 7/1993 | Schindler et al. |
| 5,306,656 A | | 4/1994 | Williams et al. |
| 5,361,038 A | | 11/1994 | Allen et al. |
| 5,365,197 A | | 11/1994 | Ikalainen |
| 5,389,571 A | | 2/1995 | Takeuchi et al. |
| 5,414,387 A | | 5/1995 | Nakahara et al. |
| 5,485,118 A | | 1/1996 | Chick |
| 5,608,353 A | | 3/1997 | Pratt |
| 5,629,648 A | | 5/1997 | Pratt |
| 5,698,870 A | | 12/1997 | Nakano et al. |
| 5,742,205 A | | 4/1998 | Cowen et al. |
| 5,764,673 A | | 6/1998 | Kawazu et al. |
| 5,834,326 A | | 11/1998 | Miyachi et al. |
| 5,843,590 A | | 12/1998 | Miura et al. |
| 5,864,156 A | | 1/1999 | Juengling |
| 5,874,747 A | | 2/1999 | Redwing et al. |
| 5,880,640 A | | 3/1999 | Dueme |
| 5,914,501 A | | 6/1999 | Antle et al. |
| 5,949,140 A | | 9/1999 | Nishi et al. |
| 6,049,250 A | | 4/2000 | Kintis et al. |
| 6,064,082 A | | 5/2000 | Kawai et al. |
| 6,110,757 A | | 8/2000 | Udagawa et al. |
| 6,130,579 A | | 10/2000 | Iyer et al. |
| 6,133,589 A | | 10/2000 | Krames et al. |
| 6,177,685 B1 | | 1/2001 | Teraguchi et al. |
| 6,191,656 B1 | | 2/2001 | Nadler |
| 6,229,395 B1 | | 5/2001 | Kay |
| 6,265,943 B1 | | 7/2001 | Dening et al. |
| 6,271,727 B1 | | 8/2001 | Schmukler |
| 6,285,239 B1 | | 9/2001 | Iyer et al. |
| 6,306,709 B1 | | 10/2001 | Miyagi et al. |
| 6,307,364 B1 | | 10/2001 | Augustine |
| 6,313,705 B1 | | 11/2001 | Dening et al. |
| 6,329,809 B1 | | 12/2001 | Dening et al. |
| 6,333,677 B1 | | 12/2001 | Dening |
| 6,342,815 B1 | | 1/2002 | Kobayashi |
| 6,356,150 B1 | | 3/2002 | Spears et al. |
| 6,369,656 B2 | | 4/2002 | Dening et al. |
| 6,369,657 B2 | | 4/2002 | Dening et al. |
| 6,373,318 B1 | | 4/2002 | Dohnke et al. |
| 6,376,864 B1 | | 4/2002 | Wang |
| 6,377,125 B1 | | 4/2002 | Pavio et al. |
| 6,384,433 B1 | | 5/2002 | Barratt et al. |
| 6,387,733 B1 | | 5/2002 | Holyoak et al. |
| 6,392,487 B1 | | 5/2002 | Alexanian |
| 6,400,226 B2 | | 6/2002 | Sato |
| 6,404,287 B2 | | 6/2002 | Dening et al. |
| 6,448,793 B1 | | 9/2002 | Barratt et al. |
| 6,455,877 B1 | | 9/2002 | Ogawa et al. |
| 6,475,916 B1 | | 11/2002 | Lee et al. |
| 6,477,682 B2 | | 11/2002 | Cypher |
| 6,521,998 B1 | | 2/2003 | Teraguchi et al. |
| 6,525,611 B1 | | 2/2003 | Dening et al. |
| 6,528,983 B1 | | 3/2003 | Augustine |
| 6,560,452 B1 | | 5/2003 | Shealy |
| 6,566,963 B1 | | 5/2003 | Yan et al. |
| 6,589,877 B1 | | 7/2003 | Thakur |
| 6,593,597 B2 | | 7/2003 | Sheu |
| 6,608,367 B1 | | 8/2003 | Gibson et al. |
| 6,614,281 B1 | | 9/2003 | Baudelot et al. |
| 6,621,140 B1 | | 9/2003 | Gibson et al. |
| 6,624,452 B2 | | 9/2003 | Yu et al. |
| 6,627,552 B1 | | 9/2003 | Nishio et al. |
| 6,633,073 B2 | | 10/2003 | Rezvani et al. |
| 6,633,195 B2 | | 10/2003 | Baudelot et al. |
| 6,639,470 B1 | | 10/2003 | Andrys et al. |
| 6,656,271 B2 | | 12/2003 | Yonehara et al. |
| 6,657,592 B2 | | 12/2003 | Dening et al. |
| 6,660,606 B2 | | 12/2003 | Miyabayashi et al. |
| 6,701,134 B1 | | 3/2004 | Epperson |
| 6,701,138 B2 | | 3/2004 | Epperson et al. |
| 6,706,576 B1 | | 3/2004 | Ngo et al. |
| 6,720,831 B2 | | 4/2004 | Dening et al. |
| 6,723,587 B2 * | | 4/2004 | Cho et al. ............ 438/151 |
| 6,724,252 B2 | | 4/2004 | Ngo et al. |
| 6,727,762 B1 | | 4/2004 | Kobayashi |
| 6,748,204 B1 | | 6/2004 | Razavi et al. |
| 6,750,158 B2 | | 6/2004 | Ogawa et al. |
| 6,750,482 B2 | | 6/2004 | Seaford et al. |
| 6,759,907 B2 | | 7/2004 | Orr et al. |
| 6,802,902 B2 | | 10/2004 | Beaumont et al. |
| 6,815,722 B2 | | 11/2004 | Lai et al. |
| 6,815,730 B2 | | 11/2004 | Yamada |
| 6,822,842 B2 | | 11/2004 | Friedrichs et al. |
| 6,861,677 B2 | | 3/2005 | Chen |
| 6,943,631 B2 | | 9/2005 | Scherrer et al. |
| 7,015,512 B2 | | 3/2006 | Park et al. |
| 7,026,665 B1 | | 4/2006 | Smart et al. |
| 7,033,961 B1 | | 4/2006 | Smart et al. |
| 7,042,150 B2 | | 5/2006 | Yasuda |
| 7,052,942 B1 | | 5/2006 | Smart et al. |
| 7,211,822 B2 | | 5/2007 | Nagahama et al. |
| 7,408,182 B1 | | 8/2008 | Smart et al. |
| 7,449,762 B1 | | 11/2008 | Singh |
| 7,459,356 B1 | | 12/2008 | Smart et al. |
| 7,557,421 B1 | | 7/2009 | Shealy et al. |
| 7,719,055 B1 | | 5/2010 | McNutt et al. |
| 7,768,758 B2 | | 8/2010 | Maier et al. |
| 7,804,262 B2 | | 9/2010 | Schuster et al. |
| 7,935,983 B2 | | 5/2011 | Saito et al. |
| 7,968,391 B1 | | 6/2011 | Smart et al. |
| 7,974,322 B2 | | 7/2011 | Ueda et al. |
| 8,017,981 B2 | | 9/2011 | Sankin et al. |
| 8,405,068 B2 | | 3/2013 | O'Keefe |
| 8,502,258 B2 | | 8/2013 | O'Keefe |
| 8,633,518 B2 * | | 1/2014 | Suh et al. ............ 257/194 |
| 8,692,294 B2 * | | 4/2014 | Chu et al. ............ 257/194 |
| 8,785,976 B2 | | 7/2014 | Nakajima et al. |
| 2001/0040246 A1 | | 11/2001 | Ishii |
| 2001/0054848 A1 | | 12/2001 | Baudelot et al. |
| 2002/0031851 A1 | | 3/2002 | Linthicum et al. |
| 2002/0048302 A1 | | 4/2002 | Kimura |
| 2002/0079508 A1 | | 6/2002 | Yoshida |
| 2003/0003630 A1 | | 1/2003 | Iimura et al. |
| 2003/0122139 A1 | | 7/2003 | Meng et al. |
| 2003/0160307 A1 | | 8/2003 | Gibson et al. |
| 2003/0160317 A1 | | 8/2003 | Sakamoto et al. |
| 2003/0206440 A1 | | 11/2003 | Wong |
| 2003/0209730 A1 | | 11/2003 | Gibson et al. |
| 2003/0218183 A1 | | 11/2003 | Micovic et al. |
| 2004/0070003 A1 | | 4/2004 | Gaska et al. |
| 2004/0130037 A1 | | 7/2004 | Mishra et al. |
| 2004/0241916 A1 | | 12/2004 | Chau et al. |
| 2005/0139868 A1 * | | 6/2005 | Anda ............ 257/213 |
| 2005/0189559 A1 | | 9/2005 | Saito et al. |
| 2005/0189562 A1 | | 9/2005 | Kinzer et al. |
| 2005/0194612 A1 * | | 9/2005 | Beach ............ 257/192 |
| 2005/0212049 A1 | | 9/2005 | Onodera |
| 2005/0225912 A1 | | 10/2005 | Pant et al. |

(56) References Cited

U.S. PATENT DOCUMENTS

| | | |
|---|---|---|
| 2005/0271107 A1 | 12/2005 | Murakami et al. |
| 2006/0043385 A1 | 3/2006 | Wang et al. |
| 2006/0068601 A1 | 3/2006 | Lee et al. |
| 2006/0124960 A1 | 6/2006 | Hirose et al. |
| 2006/0243988 A1 | 11/2006 | Narukawa et al. |
| 2007/0093009 A1 | 4/2007 | Baptist et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0278137 A1 | 11/2009 | Sheridan et al. |
| 2010/0025657 A1 | 2/2010 | Nagahama et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0095337 A1 | 4/2011 | Sato |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1 | 8/2012 | Imada |
| 2012/0262220 A1 | 10/2012 | Springett |
| 2013/0277687 A1 | 10/2013 | Kobayashi et al. |
| 2013/0280877 A1 | 10/2013 | Kobayashi et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN-GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

(56) References Cited

OTHER PUBLICATIONS

Notice of Allowance for U.S. Appl. No. 11/458,833, mailed Mar. 9, 2009, 7 pages.
Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 13/927,182, mailed May 1, 2014, 7 pages.
Non-Final Office Action for U.S. Appl. No. 13/973,482, mailed May 23, 2014, 8 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Notice of Allowance for U.S. Appl. No. 13/914,060, mailed Nov. 13, 2014, 8 pages.
Final Office Action for U.S. Appl. No. 13/966,400, mailed Dec. 3, 2014, 8 pages.
International Search Report and Written Opinion for PCT/US2013/056105, mailed Feb. 12, 2014, 15 pages.
Advisory Action for U.S. Appl. No. 13/910,202, mailed Apr. 6, 2015, 3 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Non-Final Office Action for U.S. Appl. No. 14/067,019, mailed Mar. 25, 2015, 7 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Notice of Allowance for U.S. Appl. No. 13/910,202, mailed May 14, 2015, 9 pages.
Notice of Allowance for U.S. Appl. No. 13/974,488, mailed May 29, 2015, 9 pages.
Corrected Notice of Allowance for U.S. Appl. No. 13/957,689, mailed May 20, 2015, 3 pages.
Notice of Allowance for U.S. Appl. No. 13/973,482, mailed May 4, 2015, 7 pages.

\* cited by examiner

METHODS FOR FABRICATING HIGH VOLTAGE FIELD EFFECT TRANSISTOR FINGER TERMINATIONS

RELATED APPLICATIONS

The present application claims the benefit of U.S. Provisional Patent Application No. 61/625,929 filed Apr. 18, 2012. The present application is related to concurrently filed U.S. patent application No. 13/795,926 entitled "HIGH VOLTAGE FIELD EFFECT TRANSITOR FINGER TERMINATIONS." All of the applications listed above are hereby incorporated herein by reference in their entireties.

FIELD OF THE DISCLOSURE

Embodiments of the present disclosure relate to field effect transistors having structures for protecting other structures such as gate fingers from damage resulting from high operational voltages.

BACKGROUND

Gallium Nitride (GaN) technology has widely been identified as a preferred high voltage (>600 V) power electronics technology due to its inherent high Johnson limit, which is a relationship between cutoff frequency ($f_T$) and breakdown voltage. Quantitatively, the Johnson limit is a product of $f_T$ and breakdown voltage for a particular semiconductor technology such as GaN technology. The Johnson limit for GaN technology is significantly improved over the Johnson limit for silicon technology. As a result, GaN technology is being developed to realize relatively very compact and efficient switching regulators that require small passive filter elements in comparison to silicon technologies. However, challenges remain in utilizing GaN technology for compact and efficient switching regulators as well as other commercial applications. Some of the challenges include achieving low cost, normally off operation, low leakage of drain-to-source current (Ids) and low gate leakage current (Igate), as well as low channel on-resistance (R-on).

Moreover, greater than 600 V power electronic GaN switching transistor devices require low Ids leakage current under a high drain-to-source voltage (Vds) condition. A typical power electronic GaN switch requires less than 10-20 µA/mm of Ids leakage current under 1200 V Vds operation in an off-state in order to minimize the off-power dissipation and maximize switching efficiency. In addition, the same GaN switch requires a very low on-resistance of <200 milli-Ohms in the on-state in order to minimize on-power dissipation and maximize switching efficiency. The on-resistance may be reduced by increasing the overall size of the device by increasing the gate width. However, this will increase cost and the absolute value of Igate leakage current, which is proportional to the gate width.

Excessive leakage current is a common problem with lateral high electron mobility transistor (HEMT) devices. In a lateral HEMT device, a channel surface typically needs to be passivated to reduce surface states that contribute to electron leakage transport in a lateral direction. The leakage current that results from the surface states increases with higher voltage operation and the resulting electric fields. In particular, the leakage currents and breakdown voltages are strongly influenced by peak electric fields between the gate and drain regions of a device. Excessive leakage current is often mitigated with field distribution techniques such as employing sloped gate metal, gate field plates, and source field plates over the gate-drain regions of an active device.

SUMMARY

A field effect transistor having at least one structure configured to redistribute and/or reduce an electric field away from gate fingers and methods for fabricating the same are disclosed. In the exemplary embodiments, a field effect transistor includes a substrate, an active region disposed on the substrate, at least one source finger in contact with the active region, at least one drain finger in contact with the active region, and at least one gate finger in rectifying contact with the active region. In one of the exemplary embodiments, at least one end of at least one gate finger extends outside of the active region. In another exemplary embodiment, at least one source finger includes at least one source field plate integral with at least one source finger such that at least one source field plate extends over at least one gate finger with a portion of the source field plate extending outside of the active region. Either of the exemplary embodiments can also include a sloped gate foot and/or an extended gate field plate in the longitudinal direction of the gate finger protruding outside the active region to further mitigate potentially damaging effects of high voltage operation.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

For relatively extremely high voltages 600 V and higher, the leakage current typically becomes more challenging and new leakage paths need to be addressed, such as the path between gate finger ends and associated drain regions of a device. Surface leakage currents associated with the gate finger ends become more important for 1200 V applications and above, and the field termination at the end of individual gate fingers needs to be designed to limit surface leakage currents. What is needed are structures and methods that reduce drain and gate leakage current for voltage operation that is greater than a few hundred volts for lateral field effect transistors such as GaN high electron mobility transistor (HEMT) type transistors.

Figure 1:
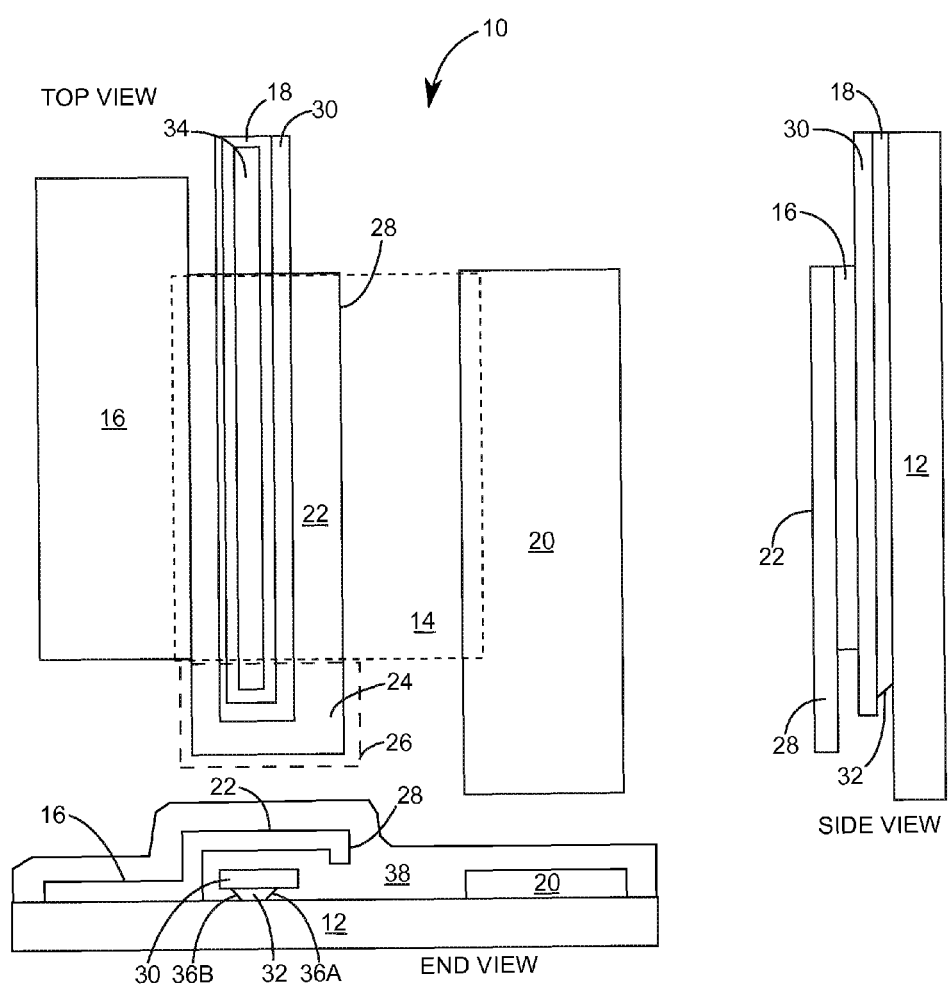
FIG. 1 is a structural diagram depicting a top view, end view, and side view of structural elements making up a field effect transistor of the present disclosure.

FIG. 1 is a structural diagram depicting a top view, end view, and side view of structural elements making up a field effect transistor 10 of the present disclosure. The field effect transistor 10 includes a substrate 12 and an active region 14 disposed on the substrate 12. At least one source finger 16 is in ohmic contact with the active region 14 while at least one gate finger 18 is in rectifying contact with the active region 14. Moreover, at least one drain finger 20 is in ohmic contact with the active region 14. In the exemplary embodiment shown in FIG. 1, at least one source field plate 22 is integral with the at least one source finger 16 such that the at least one source field plate 22 extends over the at least one gate finger 18 with a portion 24 of the at least one source field plate 22 extending outside of the active region 14. Dashed lines define a boundary between the active region 14 and an inactive region 26.

Referring to the top view, the at least one drain finger 20 typically extends to one side to combine multiple drain fingers together, which typically corresponds to an area that is commonly known as the drain finger side of the device. This structural positioning is predetermined to keep the source and drain areas away from each other in the high current draw areas. The structural positioning also has the added benefit of layout compactness. The proximity of the gate finger end portion 24 to the at least one drain finger 20 outside the active region 14 is similar to that just inside the active region 14. At high voltages, the high electric field continues to present a problem even with no active channel present within the active region 14. If the breakdown and leakage mechanisms in this region is dominated by the breakdown in a dielectric GaN epitaxial (EPI) surface interface, then the gate field termination at the end of the at least one gate finger 18 may be just as critical as inside the active region 14, especially at voltages that approach 1200 V. The typical spacing between gate edge and drain is ~10-25 µm. Thus, the electric field ~V/d does not change significantly in the proximity of an active channel/isolation region border.

Figure 2:
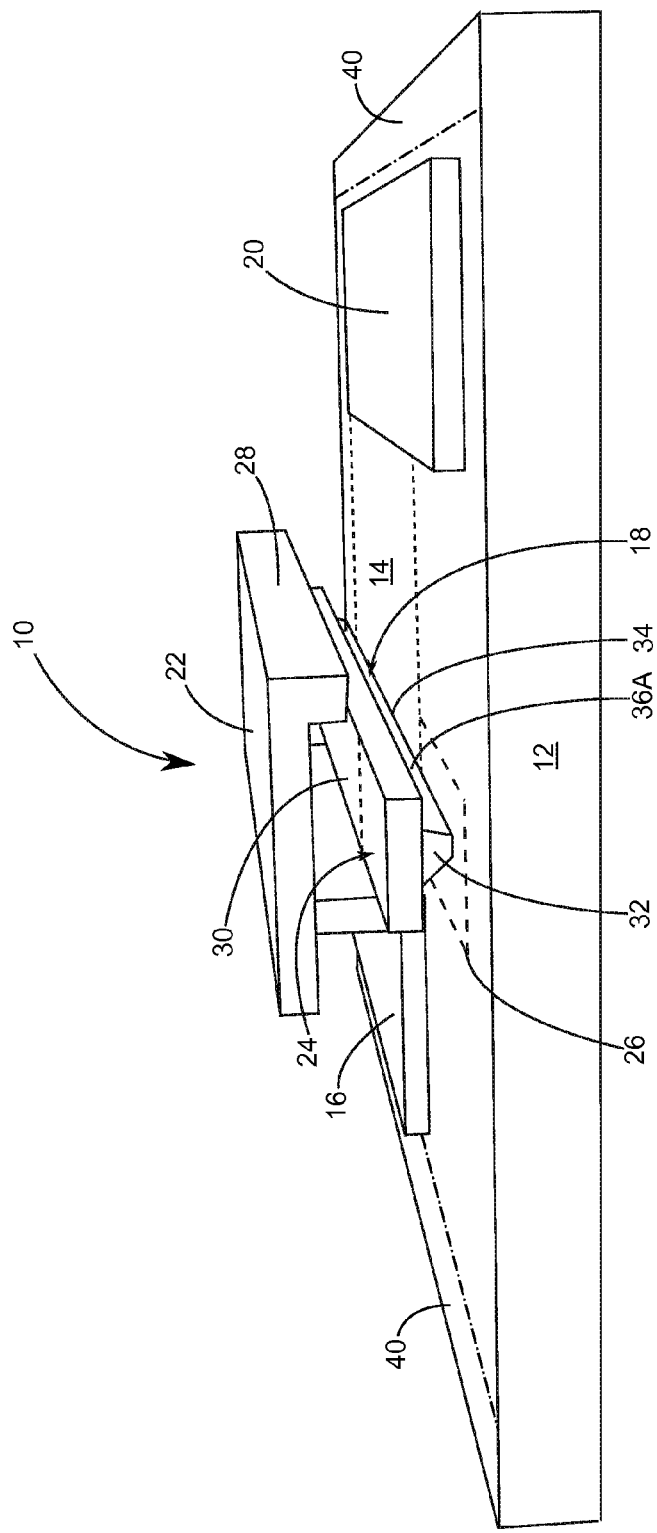
FIG. 2 is a left-side perspective view of the field effect transistor of FIG. 1.
Figure 3:
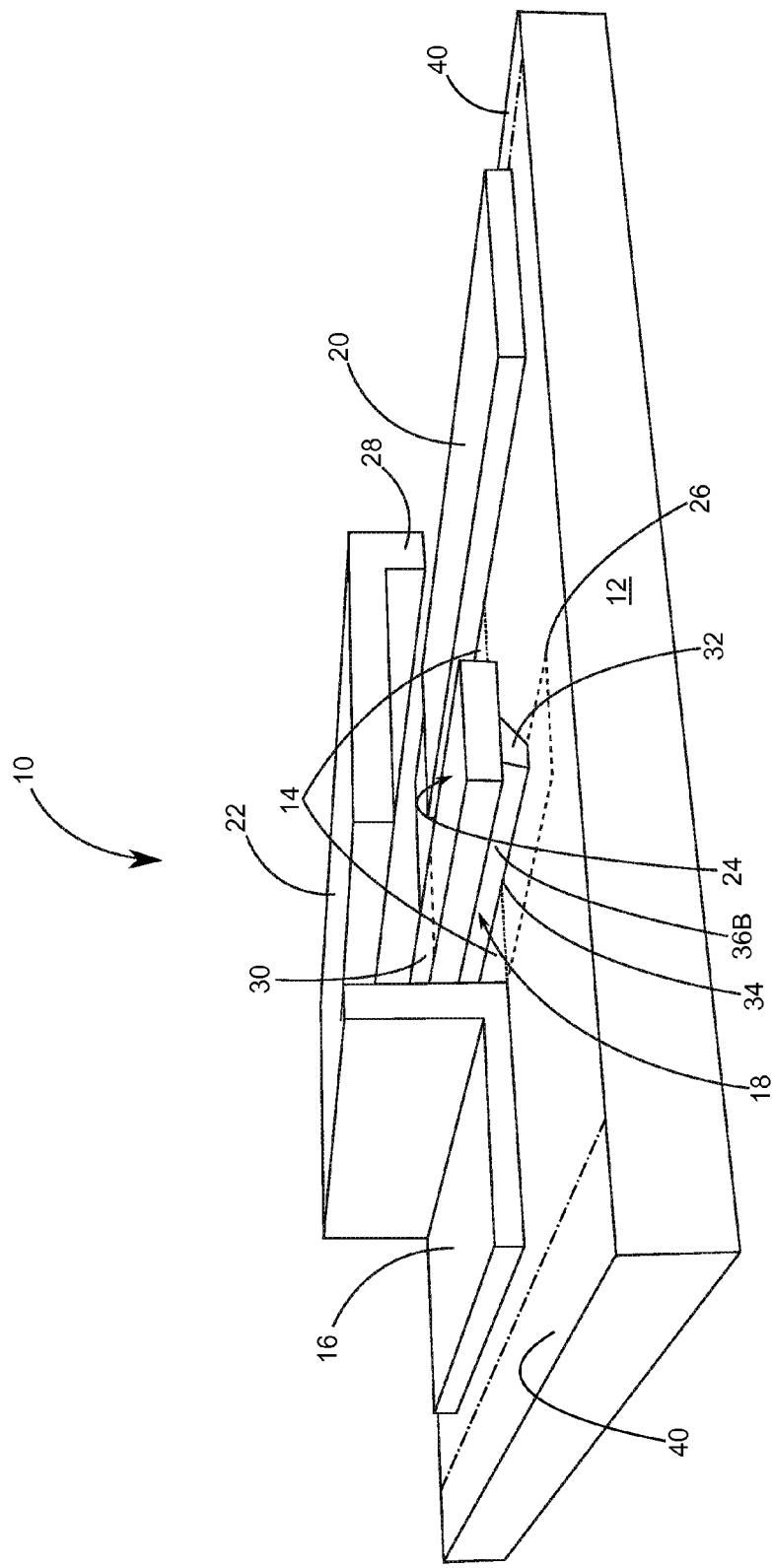
FIG. 3 is a right-side perspective view of the field effect transistor of FIG. 1.

As best seen in FIG. 2 and FIG. 3 of this exemplary embodiment, the at least one source field plate 22 also includes at least one side 28 that extends downwardly towards the substrate 12 between the at least one gate finger 18 and the at least one drain finger 20. Another feature for redistributing and/or reducing an electric field's influence on the at least one gate finger 18 is a gate field plate 30 integrated with the at least one gate finger 18. The gate field plate 30 integrated with the at least one gate finger 18 appears as a T shape or a Γ shape when viewed from an end of the at least one gate finger 18. Another electric field mitigating feature is a sloped gate foot 32 on at least one end of the at least one gate finger 18. The sloped gate foot 32 has an end that inclines downwardly towards the substrate 12. The sloped foot 32 also has a longitudinal base 34 with upwardly and outwardly inclining sides 36A and 36B.

Returning briefly to FIG. 1, a passivation dielectric layer 38 covers the at least one source finger 16, the at least one gate finger 18, and the at least one drain finger 20. The passivation dielectric layer 38 is typically required for surface passivation and voltage breakdown improvement and may consist of a multi-layer dielectric formed in multiple steps. The thickness and material of the dielectric is typically predetermined for high voltage breakdown device performance and compatibility with backside metallization processing needed to fabricate the field effect transistor 10. The passivation dielectric layer 38 that passivates the surface of the active region 14 is typically made of silicon nitride ($Si_3N_4$), but other materials with higher breakdown voltage (BV) characteristics may be substituted. These higher BV materials may become necessary as a required device operating voltage is increased to over 200 V to approach 600 V and higher, since at those potentials current leakage paths can occur at the end of the at least one gate finger 18 extending outside the active region 14.

An additional feature depicted in FIG. 2 and FIG. 3 is a device periphery 40 shown bounded between a dotted and dashed line and the lateral extents of the substrate 12. The device periphery 40 reduces opportunities for leakage current between adjacent lateral devices (not shown).

Figure 4:
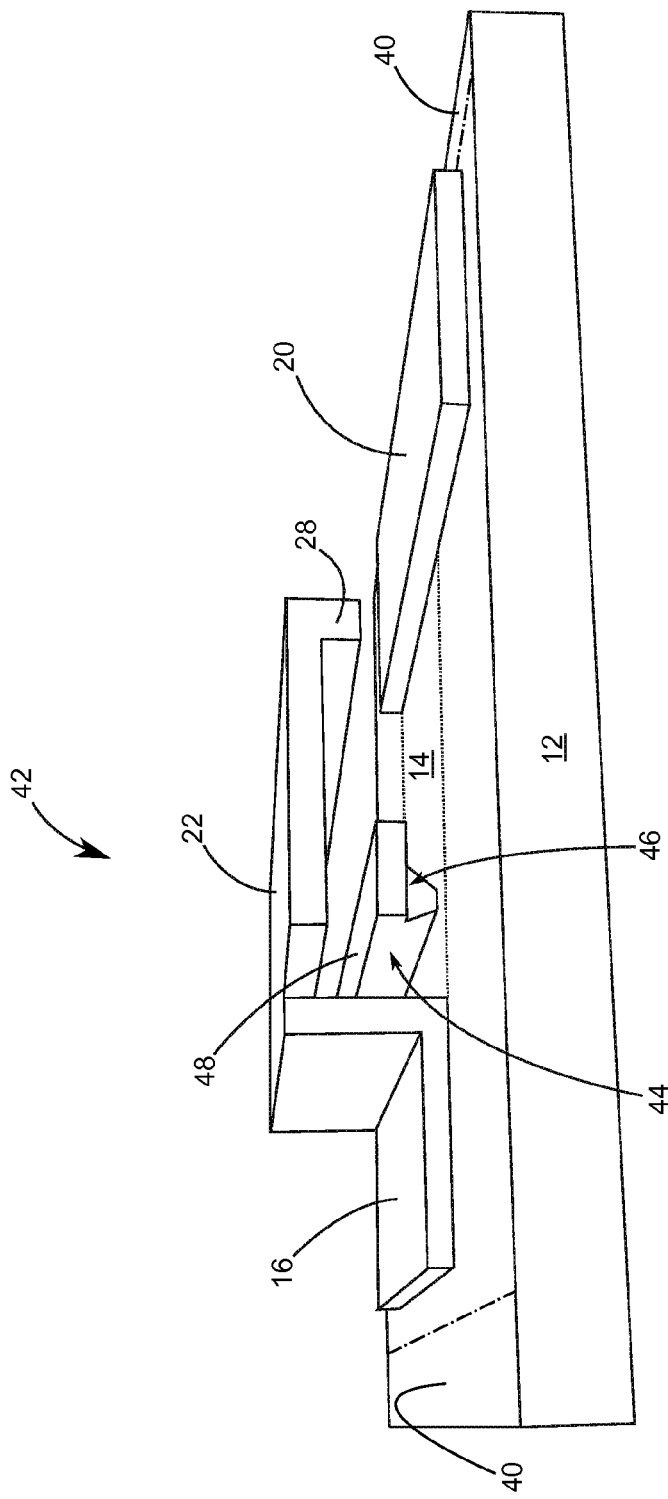
FIG. 4 is a perspective view of yet another embodiment of a field effect transistor in accordance with the present disclosure.

FIG. 4 is a left-side perspective view of a modified version of the field effect transistor 10. In this exemplary case, a field effect transistor 42 retains most of the features of the field effect transistor 10 (FIGS. 1, 2 and 3), except in this case, at least one gate finger 44 has an end 46 that does not extend outside of the active region 14. In addition, a gate field plate 48, integral with the at least one gate finger 44, appears as gamma (Γ) shaped when viewed from an end of the at least one gate finger 44.

Figure 5:
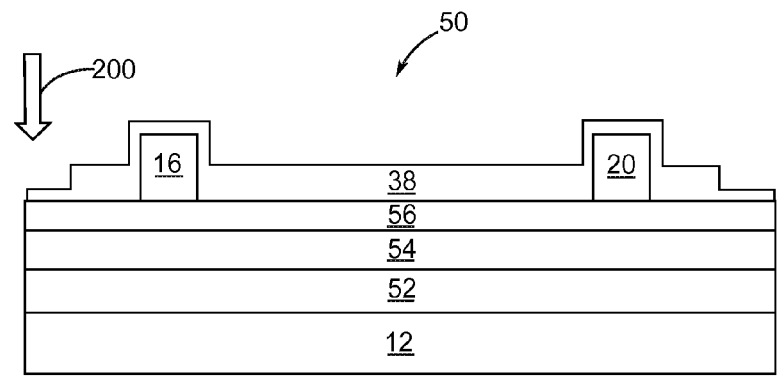
FIG. 5 is a process diagram of a method for making a field effect transistor of the present disclosure.
Figure 5:
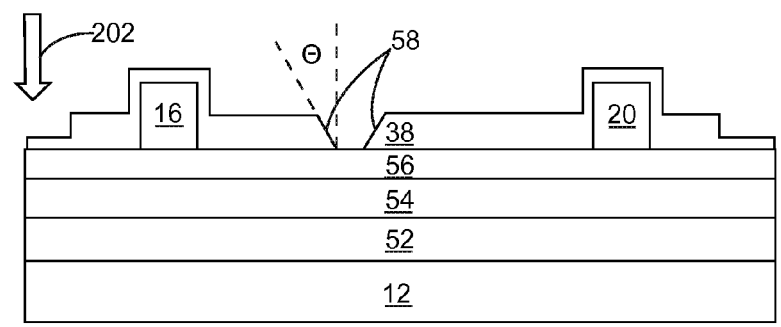
Figure 5:
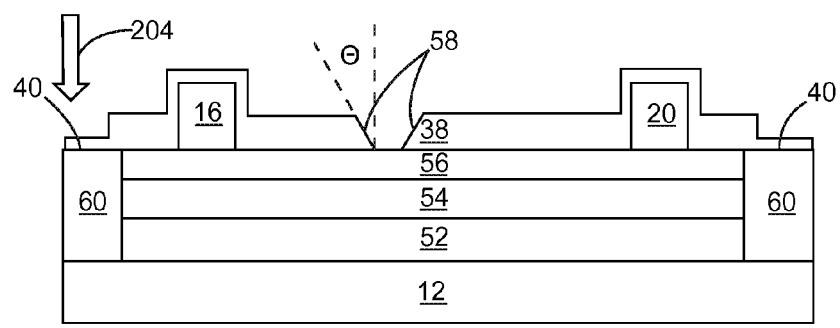

FIG. 5 is a process diagram for an exemplary first method for fabricating a sloped gate channel for the sloped gate foot 32 (FIGS. 1 through 3) and for isolating the device periphery 40 (FIGS. 2 through 4). The first method begins with providing a field effect transistor structure 50 making up a portion of the field effect transistor 10 (FIGS. 1 through 3) (step 200). The provided field effect transistor structure 50 comprises the substrate 12. A buffer layer 52 is disposed on the substrate 12 to accommodate differences in crystallographic structures between the active region 14 (FIGS. 1 through 4) and the substrate 12. The active region 14 provided in the exemplary first method includes a device layer 54 and a cap layer 56. The passivation dielectric layer 38 covers the at least one source finger 16, the at least one drain finger 20, and the active region 14.

A gate channel having inwardly sloping side walls 58 is etched into the passivation dielectric layer 38 (step 202). A slope angle Θ is predetermined to mitigate relatively high potential electric fields at a gate edge (not shown). Next, the device isolation is achieved by ion implantation 60 of the device periphery 40 (step 204). It is to be understood that device isolation by implantation can be performed either before or after the gate channel is etched into the passivation dielectric layer 38.

Figure 6:
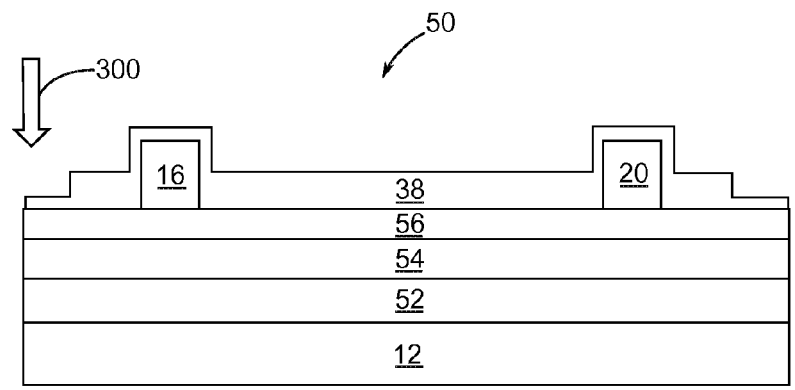
FIG. 6 is process diagram of another method for making a field effect transistor according to the present disclosure.
Figure 6:
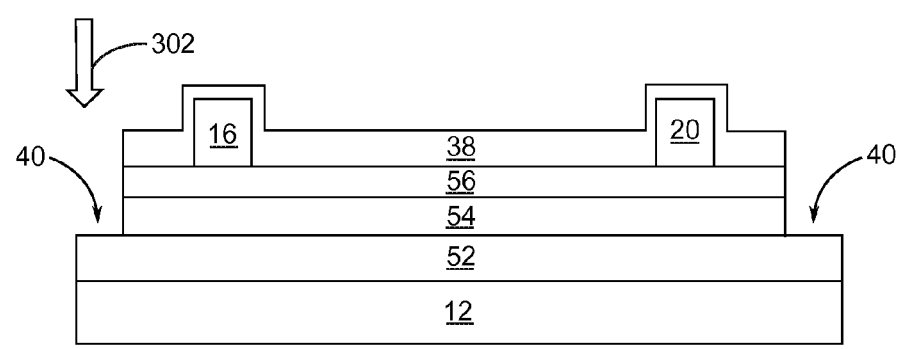
Figure 6:
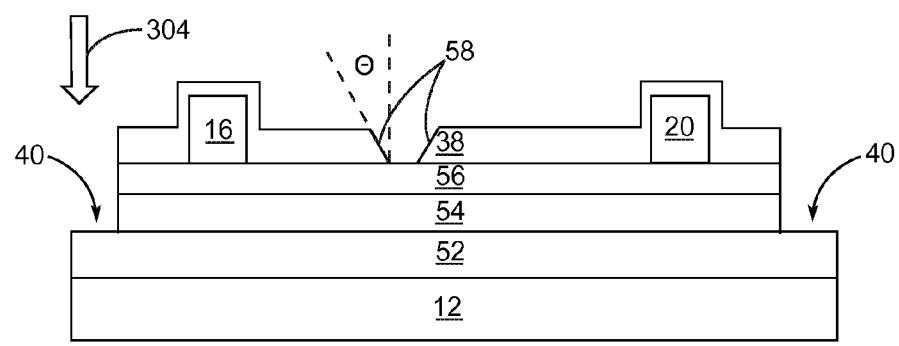

FIG. 6 is a process diagram for an exemplary second method for fabricating a sloped gate channel or via and for isolating the device periphery 40. The second method begins with providing the field effect transistor structure 50 (step 300). In this case, device isolation is achieved with mesa isolation via a mesa etch of the device periphery 40 (step 302). Next, a gate channel is fabricated by etching inwardly sloping side walls 58 (step 304). Like the previous process, the slope angle Θ is predetermined to mitigate relatively high potential electric fields at a gate edge (not shown). Selection of surface passivation material such as $Si_3N_4$ or other dielectric material is predetermined for high-voltage applications. Other characteristics such as dielectric thickness, hydrogen content, and porosity are also predetermined to mitigate high potential electric fields. Moreover, the sloped gate vias will allow for more conformal gate metal deposition thus reducing the potential for voids in metal coverage within the vias. Devices can be isolated by a mesa etch. Mesa etching may present challenges of additional topography and the need for proper surface passivation to mitigate any potential surface leakage. Mesa isolation has the potential to be more robust than implant isolation for high voltage applications.

Figure 7:
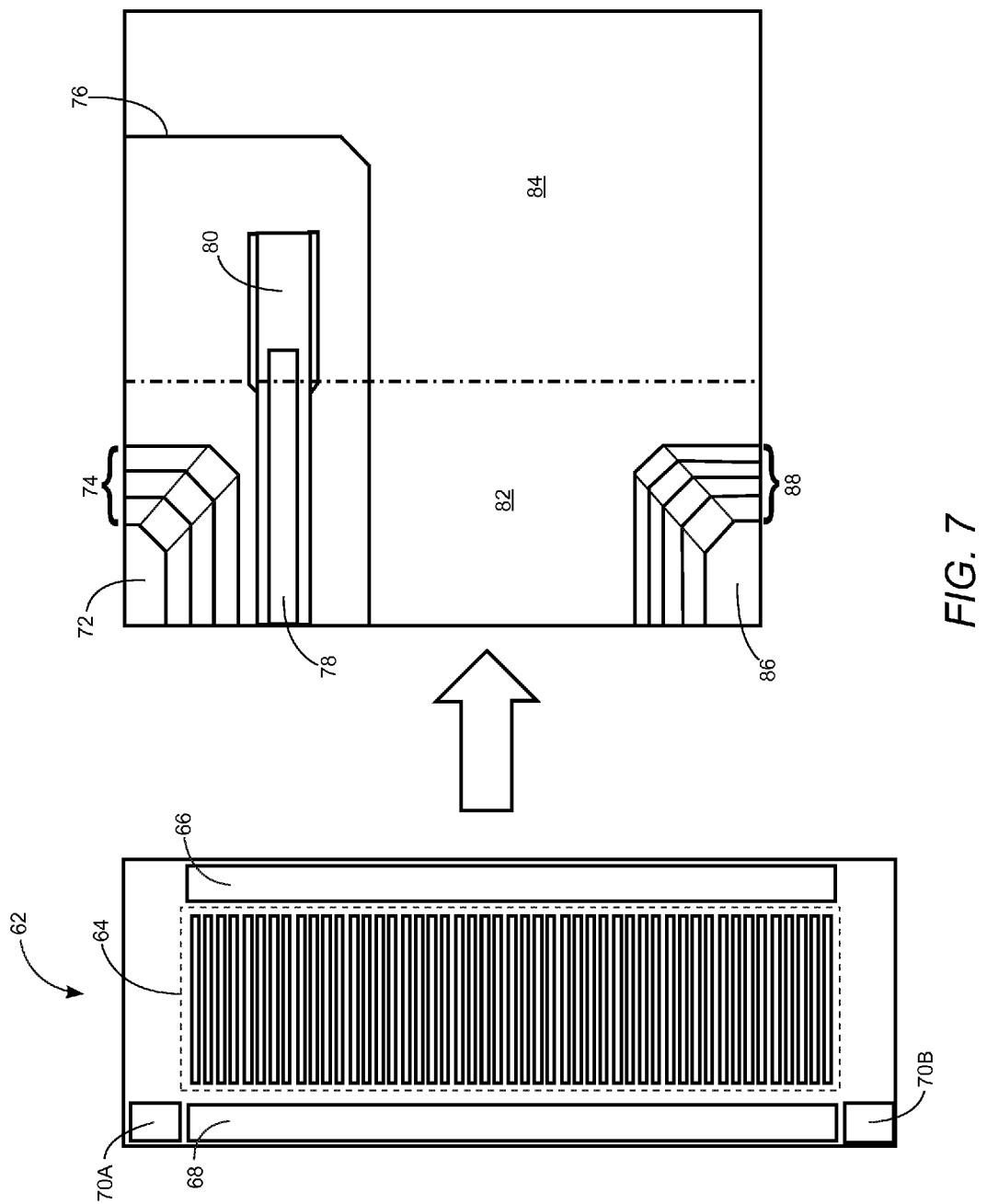
FIG. 7 is a top view of a field effect transistor of a chamfered metal and multi-finger type that is in accordance with one embodiment of the present disclosure.

FIG. 7 is a top view of a field effect transistor 62 of a chamfered metal and multi-finger type that is structured in accordance with one embodiment of the present disclosure. The field effect transistor 62 has a plurality of fingers 64 made up of alternating source and drain fingers. Gate fingers are also present between each of the source and drain fingers making up the plurality of fingers 64. However, in this top view of the field effect transistor 62, the gate fingers are not visible. A drain bus 66 is coupled to each of the drain fingers within the plurality of fingers 64. A source bus 68 is coupled to each of the source fingers within the plurality of fingers 64. A gate bus 70A and a gate bus 70B couple to the gate fingers within the plurality of fingers 64.

A magnified top view of exemplary finger ends for the plurality of fingers 64 is shown in the box to the right in FIG. 7. In particular, a portion of a source finger 72 has a chamfered metal end 74 and a chamfered metal source field plate 76 that is integral with the source finger 72. The chamfered metal source field plate 76 extends from the source finger 72 to cover a gate finger 78. A chamfered gate field plate 80 integral with the gate finger 78 extends from an active region 82 into a non-active region 84. An isolation (ISO) line depicted by a dotted and dashed line separates the active region 82 and the non-active region 84. To the left of the ISO line is the active area 82 of the field effect transistor 62. All other areas are fully isolated. Extending the gate finger 78 and gate field plate 80 into the isolated region or non-active region 84 provides for a complete blocking of any potential leakage paths at the edge of the field effect transistor 62. The extension of the gate field plate 80 further reduces any fields in the isolated regions between the plurality of gate fingers 64. Completely rounded contact/metal corners offers an improvement over chamfered corners further reducing high fields at the edges of contact/ metal traces. An end portion of the chamfered metal source field plate 76 also extends into the non-active region 84. A portion of a drain finger 86 has a chamfered metal end 88 that is located within the active region 82.

Figure 8:
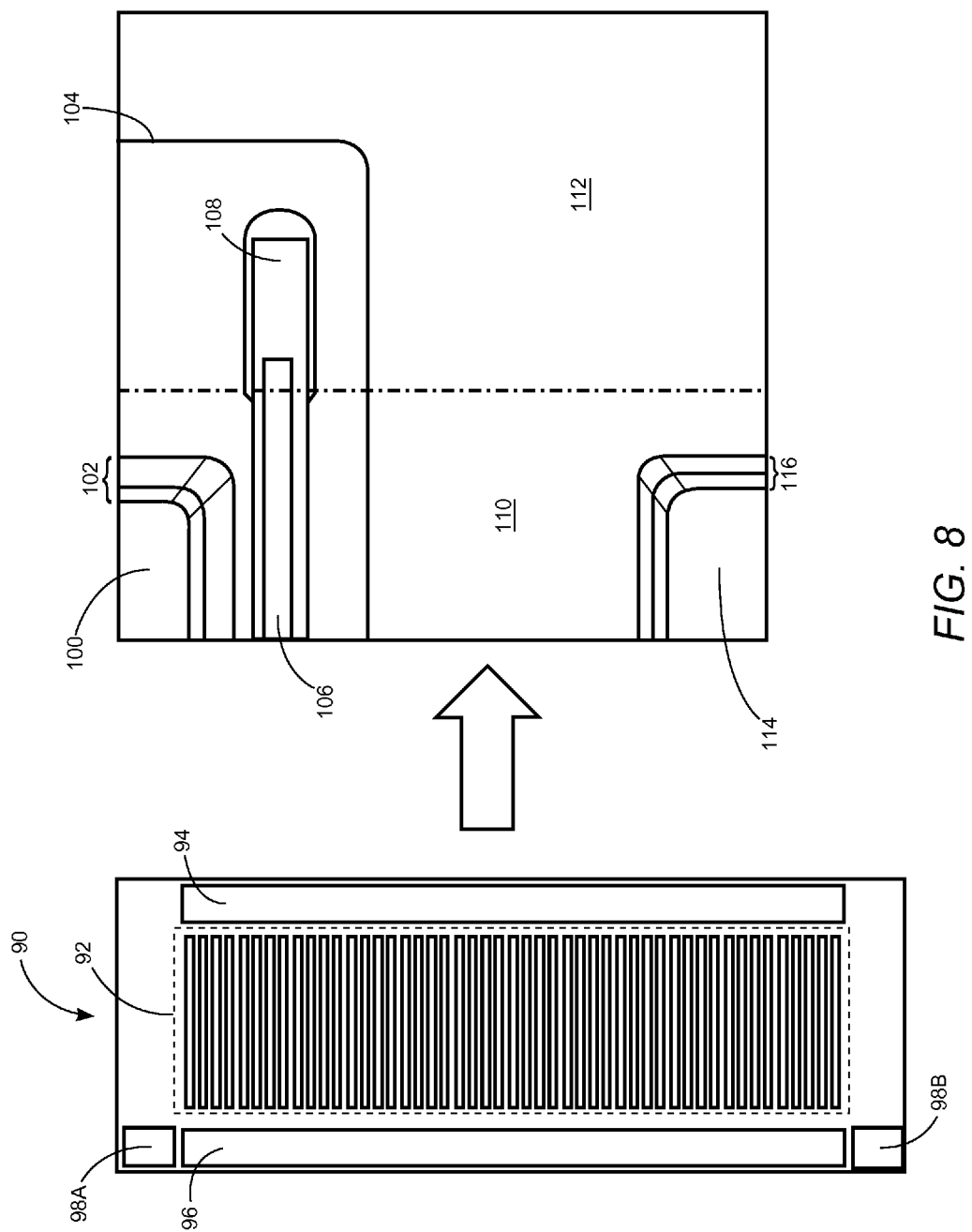
FIG. 8 is a top view of a field effect transistor of a rounded metal and multi-finger type according to another embodiment of the present disclosure.

FIG. 8 is a top view of a field effect transistor 90 of a rounded metal and multi-finger type according to another embodiment of the present disclosure. The field effect transistor 90 has a plurality of fingers 92 made up of alternating source and drain fingers. Gate fingers are also present between each of the source and drain fingers making up the plurality of fingers 92. However, in this top view of the field effect transistor 90, the gate fingers are not visible. A drain bus 94 is coupled to each of the drain fingers within the plurality of fingers 92. A source bus 96 is coupled to each of the source fingers within the plurality of fingers 92. A gate bus 98A and a gate bus 98B couple to the gate fingers within the plurality of fingers 92.

A magnified top view of exemplary finger ends for the plurality of fingers 92 is shown in the box to the right in FIG. 8. In particular, a portion of a source finger 100 has a rounded metal end 102 and a rounded metal source field plate 104 that is integral with the source finger 100. The rounded metal source field plate 104 extends from the source finger 100 to cover a gate finger 106. A rounded gate field plate 108 is integral with the gate finger 106 and extends from an active region 110 into a non-active region 112. An isolation (ISO) line depicted by a dotted and dashed line separates the active region 110 and the non-active region 112. To the left of the ISO line is the active region 110 of the field effect transistor 90. All other areas are fully isolated. Extending the gate finger 106 and gate field plate 108 into the isolated region or non-active region 112 provides for a complete blocking of any potential leakage paths at the edge of the field effect transistor 90. The extension of the gate field plate 108 further reduces any fields in the isolated regions between the plurality of fingers 92. Completely rounded contact/metal corners offers an improvement over chamfered corners further reducing high fields at the edges of contacts/metal traces. An end portion of the rounded metal source field plate 104 also extends into the non-active region 112. A portion of a drain finger 114 has a rounded metal end 116 that is located within the active region 110.

Those skilled in the art will recognize improvements and modifications to the embodiments of the present disclosure. All such improvements and modifications are considered within the scope of the concepts disclosed herein and the claims that follow.

What is claimed is:

1. A method comprising:
   providing a field effect transistor structure disposed on a substrate, the field effect transistor structure comprising;
      a buffer layer disposed on the substrate;
      a device layer disposed on the buffer layer;
      a cap layer disposed on the device layer; and
      a passivation layer disposed on the cap layer; and
   etching at least one gate channel into the passivation layer wherein at least one side of the at least one gate channel is inclined downwardly towards the cap layer with a predetermined slope that reduces electric fields at a gate edge by a predetermined amount that provides a gate leakage current that is less than around about 10 μA/mm for a drain-to-source voltage that ranges from around about 500 V to around about 1200 V.

2. The method of claim 1 further comprising implanting a predetermined number of ions into a periphery of the field effect transistor structure to provide electrical isolation for the field effect transistor structure.

3. The method of claim 1 further comprising etching a mesa around a periphery of the field effect transistor structure to provide electrical isolation for the field effect transistor structure.

4. The method of claim 1 wherein the buffer layer is made of gallium nitride (GaN).

5. The method of claim 1 wherein the device layer is made of aluminum gallium nitride/GaN (AlGaN/GaN).

6. The method of claim 1 wherein the device layer is made of GaN.

7. The method of claim 1 wherein the cap layer is made of GaN.

8. The method of claim 1 wherein the passivation layer is made of a high breakdown dielectric material.

9. The method of claim 8 wherein the high breakdown dielectric material is silicon nitride (SiN).

10. The method of claim 1 further including providing at least one source finger in contact with an active region, at least one gate finger in rectifying contact with the active region, and at least one drain finger in contact with the active region.

11. The method of claim 10 further including providing a source field plate integral with the at least one source finger such that the at least one side extends downwardly towards the active region between the at least one gate finger and the at least one drain finger.

12. The method of claim 10 further including providing a gate field plate integrated with the at least one gate finger.

13. The method of claim 12 wherein the gate field plate integrated with the at least one gate finger appears as a T shape or alternatively a Γ shape when viewed from an end of the at least one gate finger.

14. The method of claim 10 further including providing the at least one gate finger with chamfered ends.

15. The method of claim 10 further including providing the at least one gate finger with rounded ends.

16. The method of claim 10 wherein the at least one gate finger has an end with a sloped foot.

17. The method of claim 16 wherein the sloped foot inclines downwardly towards the substrate.

18. The method of claim 10 wherein at least one end of the at least one gate finger extends outside of the active region.

19. The method of claim 10 wherein the at least one gate finger is confined within the active region.

* * * * *